United States Patent [19]
Busking

[11] Patent Number: 5,659,253
[45] Date of Patent: Aug. 19, 1997

[54] TEMPERATURE COMPENSATED RADIO FREQUENCY DETECTOR CIRCUIT

[75] Inventor: Erik B. Busking, Den Haag, Netherlands

[73] Assignee: Lucent Technologies Inc., Murray Hill, N.J.

[21] Appl. No.: 436,067

[22] Filed: May 5, 1995

[30] Foreign Application Priority Data

Nov. 17, 1994 [GB] United Kingdom .................. 9423158

[51] Int. Cl.$^6$ .............. G01R 27/04; H03D 1/06; H04B 1/04
[52] U.S. Cl. ................ 324/648; 324/645; 329/352; 455/126
[58] Field of Search .................. 324/645, 648; 329/352; 455/126

[56] References Cited

U.S. PATENT DOCUMENTS

| | | | |
|---|---|---|---|
| 3,109,992 | 11/1963 | Elliot | 329/352 |
| 4,791,380 | 12/1988 | Chiappetta | 329/352 |
| 5,448,770 | 9/1995 | Hietala et al. | 455/126 |
| 5,471,654 | 11/1995 | Okazaki et al. | 455/126 |

FOREIGN PATENT DOCUMENTS

| | | | |
|---|---|---|---|
| 57-61310 | 4/1982 | Japan | 329/352 |
| 57-154912 | 9/1982 | Japan | 329/352 |
| 62-241406 | 10/1987 | Japan | 329/352 |

*Primary Examiner*—Kenneth A. Wieder
*Assistant Examiner*—Diep Do
*Attorney, Agent, or Firm*—Christopher N. Malvone

[57] ABSTRACT

An RF detector circuit (28), which may be utilized in an output power control loop (10) for an RF transmitter, includes a bridge circuit (50) including a first arm (52) containing a first diode (D2) which rectifies the RF signal and a second arm (54) which contains a second diode (D3) series-coupled to the first diode (D2), and having an RF bypass capacitor (C4). The second diode (D3) serves as a temperature compensator for the first diode (D2). The outputs of the bridge circuit (50) are connected to the inputs of a differential amplifier circuit (32) which provides a signal for use in the power control loop (10). The detector input signal is derived from the sense output of a directional coupler (22). In a second embodiment the compensating diode (D13) has its cathode coupled to the cathode of the rectifying diode (D12), and the full voltage across the rectifying diode (D12) is applied to the differential amplifier circuit (32).

4 Claims, 3 Drawing Sheets

TEMPERATURE COMPENSATED RADIO FREQUENCY DETECTOR CIRCUIT

BACKGROUND OF THE INVENTION

1. Field of the Invention

This invention relates to RF (radio frequency) detector circuits.

The invention has a particular application for use in RF power control loops such as are utilized in RF transmitters for transmitting RF signals.

2. Description of the Related Art

The use of a diode provides a simple means for detecting RF signals. However such a detector has the disadvantage that its response tends to vary with changes in ambient temperature.

UK Patent Application No. 2 276 992 discloses detecting circuitry for detecting RF signals, including a first current source for generating a first current, a first current mirror device coupled to the first current source for producing a first mirror current, and a rectifying circuit biased on the first mirror current and rectifying RF signals to produce an output signal. The first current source generates a first current having a positive temperature coefficient of change with temperature; a second source generates a second current having a negative coefficient of change with temperature; and a second current mirror device combines the first and second currents to produce a second mirror current which is coupled to the first current mirror device. This known detector circuit compensates for temperature variations, but is of complex and expensive construction.

SUMMARY OF THE INVENTION

It is an object of the present invention to provide a detector circuit for RF signals which provides compensation for temperature variations, yet is of simple and inexpensive construction.

Therefore, according to the present invention, there is provided a detector circuit for detecting an RF input signal, including first diode means adapted to rectify said RF input signal and to provide a rectified signal representative of said RF input signal on an output, characterized by second diode means coupled to said first diode means and adapted to effect temperature compensation for said rectified signal.

BRIEF DESCRIPTION OF THE DRAWINGS

Two embodiments of the present invention will now be described by way of example, with reference to the accompanying drawings, in which.

DETAILED DESCRIPTION OF THE INVENTION

Figure 1:
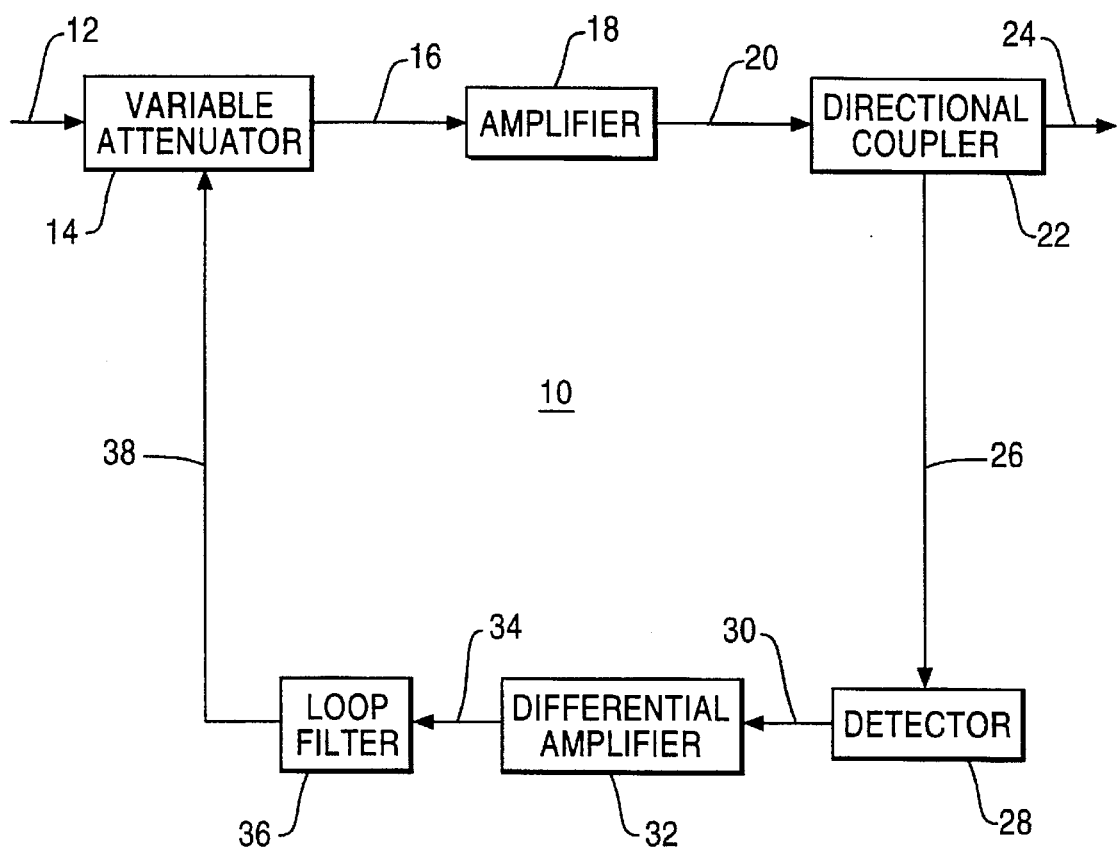
FIG. 1 is a block diagram of an RF power control loop including a detector circuit according to the present invention.

Referring first to FIG. 1, there is shown a block diagram of a power control loop 10, suitable for use in an RF transmitter (not shown) coupled to an antenna (not shown) transmitting RF signals. The loop 10 controls the power of the transmitted RF signals, as is desirable in such transmitters.

The power control loop 10 includes an input line 12 which receives incoming RF signals to be transmitted. The input line 12 is connected to a variable attenuator 14 which is connected over a line 16 to an RF amplifier 18, connected over a line 20 to a directional coupler 22. The directional coupler 22 has a main output line 24 which carries an output RF signal which is coupled to further circuitry, including an antenna for RF transmission purposes.

The directional coupler 22 further has a sense output line 26 which is coupled to a detector circuit 28, which detects the signal on the sense line 26 and provides a corresponding signal level on a connection 30 which is coupled to a differential amplifier 32. The differential amplifier 32 is connected over a line 34 to a loop filter 36 which is coupled over a line 38 to control the attenuation effected by the variable attenuator 14.

Figure 2:
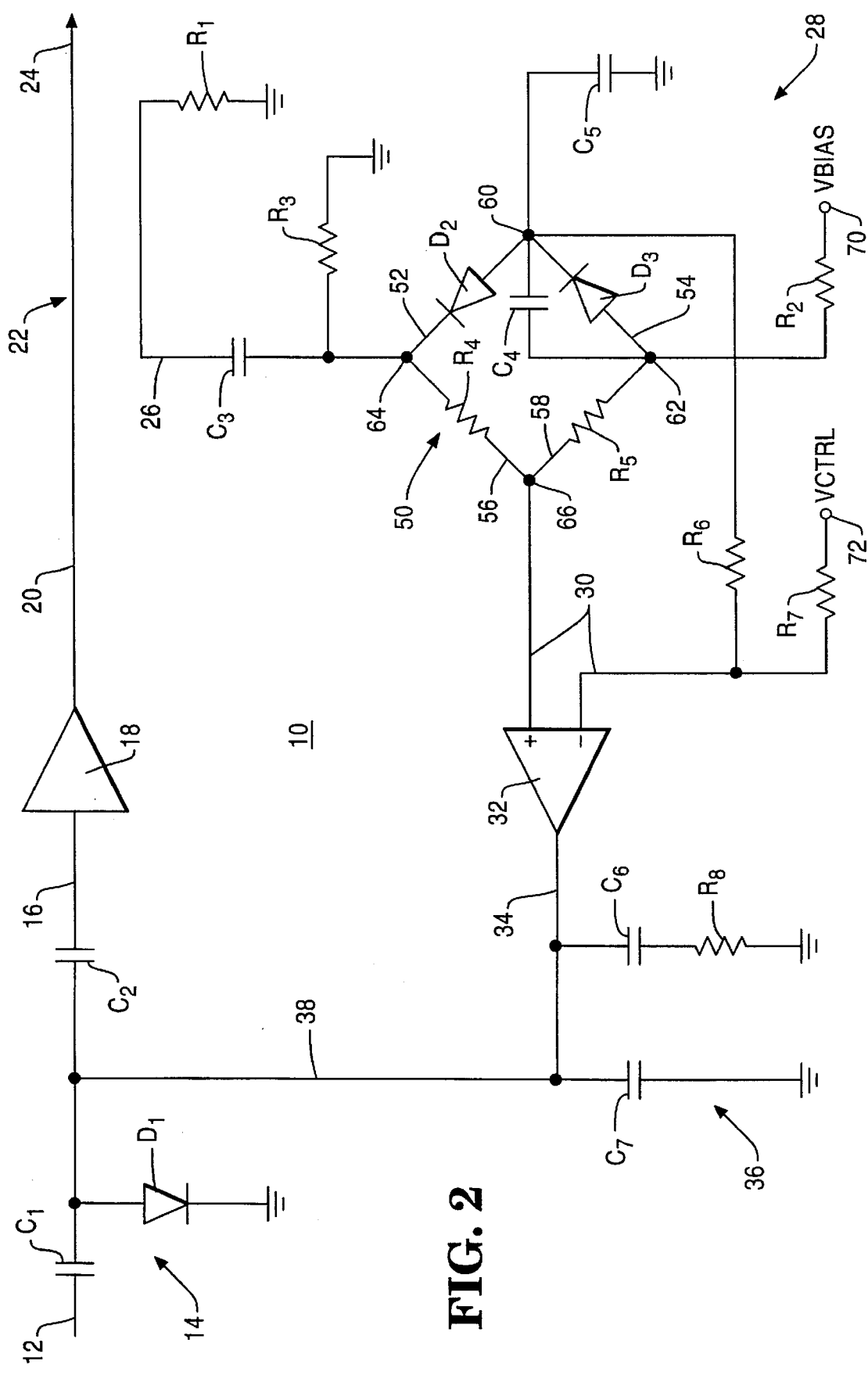
FIG. 2 is a circuit diagram of the RF power control loop shown in FIG. 1.

Referring now to FIG. 2, there is shown a circuit diagram corresponding to the block diagram of FIG. 1, and showing the power control loop 10, which is preferably embodied in an integrated circuit. The input line 12 is connected via a DC blocking capacitor C1 to a diode D1, forming the variable attenuator 14. The diode D1 is connected via a further DC blocking capacitor C2 to the RF amplifier 18, connected over the line 20 to the directional coupler 22. The directional coupler 22 has a main output 24, a sense output 26 and a terminator output connected via a resistor R1 to ground.

The sense output 26 of the directional coupler 22 is coupled via a DC blocking capacitor C3 to the detector circuit 28, which includes diodes D2 and D3, capacitors C4 and C5, and resistors R2 to R7. The capacitor C3 blocks DC voltages and provides the input signal for the detector circuit 28. The capacitor C3 is connected to a bridge circuit 50 which has four arms 52, 54, 56, and 58 connecting four nodes 60, 62, 64, and 66. The bridge arm 52 includes the diode D2 having its anode connected to the node 60 and its cathode connected to the node 64, to which the capacitor C3 is connected. The arm 54 includes the diode D3, which has its anode coupled to the node 62 and its cathode coupled to the node 60. The arm 56 includes the resistor R4, coupled between the nodes 64 and 66, and the arm 58 includes the resistor R5, coupled between the nodes 62 and 66. The diodes D2 and D3 have identical characteristics, and the resistors R4 and R5 are of equal value.

The capacitor C4 is connected between the nodes 60 and 62 to form a low impedance for RF signals across the diode D3. The capacitor C5 is connected between the node 60 and ground to provide a ground path for the RF signals. A terminal 70, to which is applied a DC bias voltage, is connected through the resistor R2 to the node 62. The node 64 is coupled through the resistor R3 to ground. This arrangement provides a DC bias circuit for the diodes D2 and D3, extending from the terminal 70 to ground.

The node 66 is connected to the positive input of the differential amplifier 32 and the node 60 is connected through the resistor R6 to the negative input of the differential amplifier 32. A terminal 72 to which is connected a DC control voltage VCTRL, is also connected, via the resistor R7, to the negative input of the differential amplifier 32. The resistors R4, R5, R6 and R7 are chosen such that the resistance connected to the positive input of the differential amplifier 32 is substantially equal to the resistance connected to the negative input.

The output of the differential amplifier 32 is connected to the loop filter 36, which includes a capacitor C6 connected via a resistor R8 to ground, and a capacitor C7 connected directly to ground. The loop filter 36 is connected over the line 38 to the diode D1 in the variable attenuator 14.

3

The operation of the detector circuit 50 will now be described. It should first be noted that the bias voltage VBIAS applied to the terminal 70, and the circuit extending therefrom via the resistor R2, diode D3, diode D2, resistor R3 and ground provides a bias for the diodes D2 and D3 and also assists in providing the differential amplifier 32 with input voltages within its operating range. The current flowing through the diode D2 is chosen so that the dynamic impedance of D2 is matched to the characteristic impedance of the sense output 26 of the directional coupler 22. In the absence of an RF signal on the sense output 26, the voltages at the two inputs of the differential amplifier 32 are equal, and all DC voltages in the detector circuit 50 are in equilibrium.

When an RF signal is present, the diode D2 will respond, due to its nonlinear characteristic, by generating a DC offset from the equilibrium state, resulting in a change in the DC voltages in the detector circuit 28, including, in particular, a change in the voltage at the input of the differential amplifier 32, such as to produce a voltage and current change at the output of the differential amplifier 32. The diode D3 is not affected by the RF signal because capacitor C4 forms a low impedance thereacross.

It will be appreciated that the bridge circuit effects temperature compensation for the detector circuit 28 since the diodes D2 and D3 are equally affected by any temperature changes. It should also be noted that the output nodes 60, 66 of the bridge circuit 50 are connected to respective inputs of the differential amplifier 32 which, being of symmetrical construction, and taking into account that the common mode input bias current of the differential amplifier 32 will not lead to a change in differential input voltage due to the selected resistance values R4 to R7, is also temperature independent in its operation.

In a modified arrangement, the diodes D2 and D3 need not have identical characteristics, provided that the relative values of R4 and R5 are adjusted accordingly.

Figure 3:
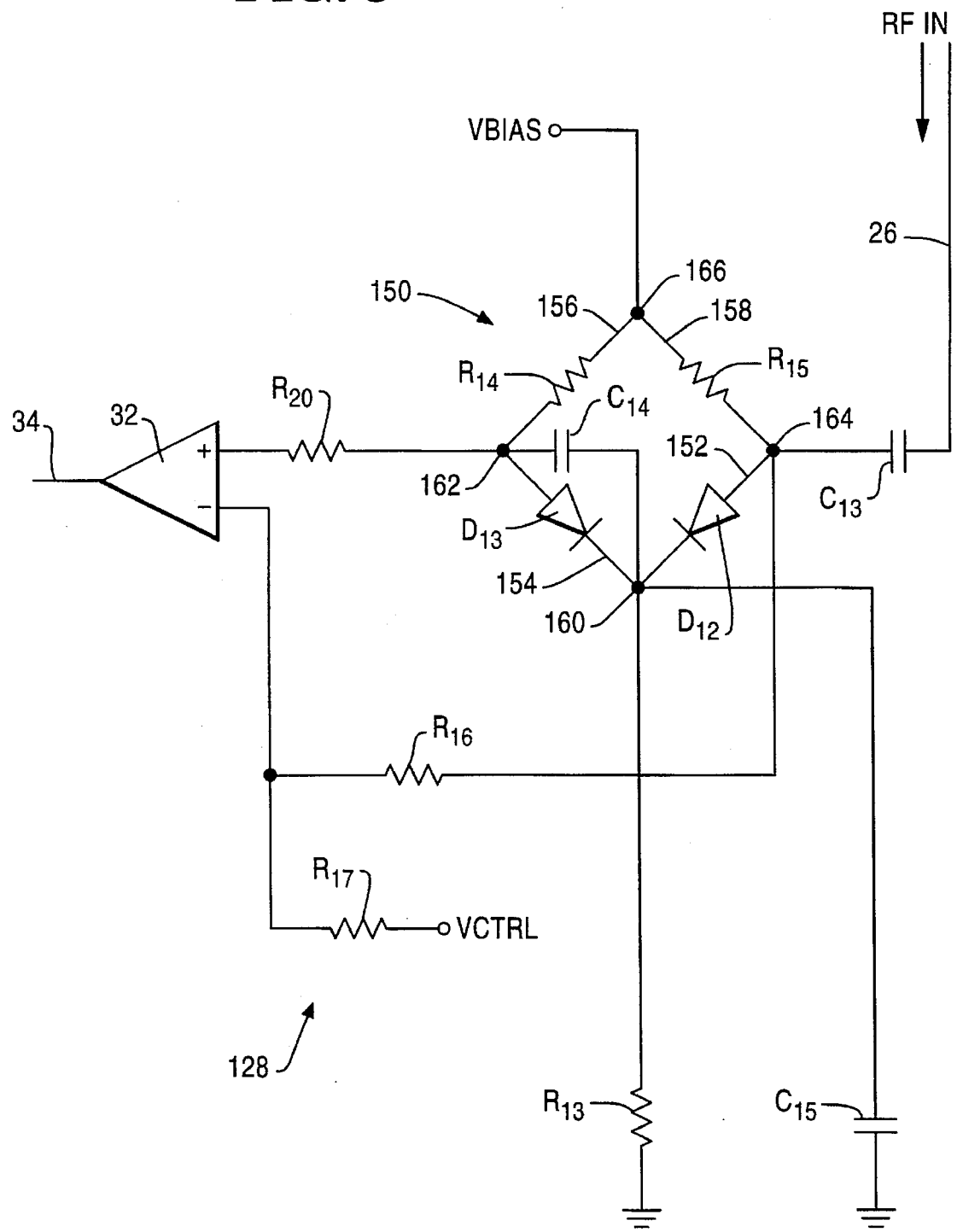
FIG. 3 is a circuit diagram of an alternative embodiment of the detector circuit.

Referring now to FIG. 3, there is shown an alternative embodiment for the detector circuit 28. In FIG. 3, the component references have an initial "1" inserted in the corresponding component references in FIG. 2 A resistor R20 does not have a counterpart in FIG. 2. Briefly, the detector circuit 128 shown in FIG. 3 includes a bridge circuit 150 having four arms 152, 154, 156 and 158 containing, respectively, diode D12, diode D13, resistor R14 and resistor R15. The resistors R14 and R15 are of equal value and the diodes D12 and D13 have equal characteristics. The RF input signal is applied over line 26 and capacitor C13 to the input node 164 of the bridge circuit 150. The principal difference as compared with the bridge circuit 50 (FIG. 2) is that in the bridge circuit 150 of FIG. 3, substantially the full voltage across the diode D12 (corresponding to diode D2 in FIG. 2), is applied to the differential amplifier 32. The detector circuit 128 thus has a greater sensitivity. It will be appreciated that in the bridge circuit 150 the RF input signal is applied to the anode of the diode D12, and the cathodes of the diodes D12 and D13 are connected together at the node 160. Also, the input node 164 acts also as an output node and is connected, over resistor R16 to the negative input of the differential amplifier 32. The node 162 is connected over the resistor R20 to the positive input of the differential amplifier 32. The bias voltage VBIAS is connected to the node 165, between bridge arms 156 and 158 which include resistors R14 and R15, respectively. The node 160, which, as mentioned above, is connected to the cathodes of diodes D12 and D13 in bridge arms 152 and 154,

4 respectively, is connected to ground via capacitor C15 and via resistor R13. The resistor values in the detector circuit 128 are again chosen such that equal resistance is coupled to the inputs of the differential amplifier 32. The diode D13 compensates for temperature variations in a similar manner to the diode D3 in the first embodiment.

Although the detector circuit 28 has been described as a component in a power control loop 10, other applications are possible. For example, the detector circuit could be utilized in a power meter.

What is claimed is:

1. A detector circuit for detecting an RF input signal, comprising:

a bridge circuit having a first node, a second node, a third node and a fourth node;

a first diode electrically connected to said first and second nodes, said first diode being adapted to rectify the RF input signal;

a second diode electrically connected to said second and third nodes;

a first resistor electrically connected to said first and fourth nodes;

a second resistor electrically connected to said third and fourth nodes; and a capacitor electrically connected in parallel with said second diode, said first node being arranged to receive the RF voltage, said fourth node being arranged to receive a bias voltage, said second node providing a first output signal to a first input of a differential amplifier circuit and said fourth node providing a second output signal to a second input of a differential amplifier circuit.

2. Detector circuitry according to claim 1, wherein said first and second diodes have equal characteristics, and said first and second resistors have equal resistor values.

3. Detector circuit according to claim 1, wherein said RF input signal is applied from a sense output of a coupling device and in that said bias voltage (VBIAS) is arranged to provide a current through said first diode such that the dynamic impedance of said first diode matches the characteristic impedance of said sense output of said coupling device.

4. A detector circuit for detecting an RF input signal, comprising: a bridge circuit having a first node, a second node, a third node and a fourth node;

a first diode electrically connected to said first and second nodes, said first diode being adapted to rectify the RF input signal;

a second diode electrically connected to said second and third nodes;

a first resistor electrically connected to said first and fourth nodes;

a second resistor electrically connected to said third and fourth nodes; and a capacitor electrically connected in parallel with said second diode, said first node being arranged to receive the RF voltage, said fourth node being arranged to receive a bias voltage, said first node providing a first output signal to a first input of a differential amplifier circuit through a third resistor and said third node providing a second output signal to a second input of a differential amplifier circuit through a fourth resistor.

* * * * *